US009991852B2

(12) United States Patent
Andersen

(10) Patent No.: US 9,991,852 B2
(45) Date of Patent: Jun. 5, 2018

(54) SYSTEM AND METHOD FOR CLOSE-DOWN POP REDUCTION

(71) Applicant: ICEpower a/s, Søborg (DK)

(72) Inventor: Kennet Skov Andersen, Søborg (DK)

(73) Assignee: ICEpower a/s, Søborg (DK)

( * ) Notice: Subject to any disclaimer, the term of this patent is extended or adjusted under 35 U.S.C. 154(b) by 0 days. days.

(21) Appl. No.: 15/528,934

(22) PCT Filed: Nov. 2, 2015

(86) PCT No.: PCT/EP2015/075433
§ 371 (c)(1),
(2) Date: May 23, 2017

(87) PCT Pub. No.: WO2016/083081
PCT Pub. Date: Jun. 2, 2016

(65) Prior Publication Data
US 2017/0317651 A1 Nov. 2, 2017

(30) Foreign Application Priority Data

Nov. 26, 2014 (DK) .................................. 2014 00684
Jun. 17, 2015 (DK) .................................. 2015 00344

(51) Int. Cl.
H03F 1/14 (2006.01)
H03F 1/30 (2006.01)
(Continued)

(52) U.S. Cl.
CPC .............. *H03F 1/305* (2013.01); *H03F 1/02* (2013.01); *H03F 3/183* (2013.01); *H03F 3/217* (2013.01);
(Continued)

(58) Field of Classification Search
CPC ....... H03F 3/181; H03F 3/183; H03F 2200/03
(Continued)

(56) References Cited

U.S. PATENT DOCUMENTS 8,232,678 B2    7/2012  Andersen
2006/0103458 A1* 5/2006 Hansen .................. H03F 3/211
                                                        330/10

(Continued)

FOREIGN PATENT DOCUMENTS

CN         101018041        8/2007

OTHER PUBLICATIONS

International Search Report and Written Opinion from PCT Application No. PCT/EP2015/075433 filed Nov. 2, 2015 (published as WO 2016083081 on Jun. 2, 2016) which is the parent application to the instant application; dated Feb. 3, 2016, 12 pages.

*Primary Examiner* — Steven J Mottola
(74) *Attorney, Agent, or Firm* — Harness, Dickey & Pierce, P.L.C.

(57) ABSTRACT

A close-down pop reduction system and a method for close-down pop reduction in an audio amplifier assembly are disclosed. The switching power conversion system comprises a forward path having a compensator and a switching power stage and a signal path from an output of a comparator in the switching power stage to a sequence control unit. The signal path includes a close-down timing circuit configured to provide a timing signal. The sequence control unit is configured to eliminate the input signal, increase the switch frequency of the close-down pop reduction system and disable the switching power stage at a moment in time within a PWM pulse of the switching power stage. Hereby, it is e.g. possible to minimize the audible pop during close-down of audio amplifier assemblies.

10 Claims, 8 Drawing Sheets

(51) Int. Cl.
    *H03F 3/183*     (2006.01)
    *H03G 3/30*     (2006.01)
    *H03F 3/217*     (2006.01)
    *H03F 1/02*     (2006.01)

(52) U.S. Cl.
    CPC ......... *H03G 3/301* (2013.01); *H03F 2200/03* (2013.01); *H03F 2200/129* (2013.01); *H03F 2200/135* (2013.01); *H03F 2200/426* (2013.01); *H03F 2200/441* (2013.01); *H03F 2200/444* (2013.01); *H03F 2200/66* (2013.01); *H03F 2200/78* (2013.01); *H03G 2201/106* (2013.01)

(58) Field of Classification Search
    USPC .................................... 330/10, 51; 381/94.5
    See application file for complete search history.

(56) References Cited

U.S. PATENT DOCUMENTS

| | | |
|---|---|---|
| 2009/0102550 A1 | 4/2009 | Ohama |
| 2014/0062592 A1 | 3/2014 | Chang |
| 2016/0118949 A1* | 4/2016 | Zhang .................... H03F 1/305 330/251 |

* cited by examiner

SYSTEM AND METHOD FOR CLOSE-DOWN POP REDUCTION

This patent application is a U.S. national stage filing under 35 U.S.C. § 371 of International Application No. PCT/EP2015/075433 filed Nov. 2, 2015 (published as WO 2016/083081 on Jun. 2, 2016), which claims priority of Denmark Application No. PA201400684 filed Nov. 26, 2014 and Denmark Application No. PA201500344 filed Jun. 17, 2015. The disclosures of the applications identified in this paragraph are incorporated herein by reference in their entirety.

FIELD OF THE INVENTION

This invention relates to a switching power conversion system such as DC-AC, DC-DC or AC-AC conversion systems or any combination of the above mentioned. More specifically, the invention relates to close-down pop elimination in an audio amplifier.

The invention may advantageously be used for improved close down in any audio amplifier system, in particular high precision DC-AC power conversion systems such as high efficiency audio amplification.

BACKGROUND

The close down pop elimination system (i.e. pop elimination in an audio amplification system) can be a central element of an audio power conversion system.

Most audio power converters are based on a PWM (Pulse-width modulation) modulator (digital modulator or analogue modulator) that converts a pulse-code-modulated signal (PCM) received from a source such as a CD-player, or an analogue signal preceded by a D/A converter, to for instance a pulse-width-modulated signal.

The output signal of the modulator is fed to a power stage where it is amplified. A typical power converter includes a switching power conversion stage, a filter and an analogue control system.

At close-down of the audio power conversion system, a general problem is the presence of an audible signal at the output of the system even though there is no input signal applied to the audio power conversion system. The signal at the output at close-down is called pop. A contributing source to the pop can be energy stored in the demodulation filter.

Another contributing source of the close-down pop can be non-controllable conduction of the MOSFETs at close-down which depends on the timing of the power stage.

WO 2008072212 describes a system with an added extra power stage.

US 20060182266 describes a system with charging of a DC block capacitor, which system is not for minimizing close-down pop in other types of systems.

There is therefore a need for an improved system and method for minimizing the close-down pop often present in audio power conversion systems.

SUMMARY OF THE INVENTION

It is therefore an object of the present invention to provide a system and a method for an audio amplifier assembly which alleviates all or at least some of the above-discussed drawbacks of the presently known systems.

This object is achieved by means of a close-down reduction system for and audio amplifier assembly and a method for close-down pop reduction in an audio amplifier assembly as defined in the appended claims.

According to one aspect of the present invention, there is provided a close-down pop reduction system for an audio amplifier assembly having an input signal and an output signal, where the close-down pop reduction system comprises:

a forward path comprising a compensator and a switching power stage; and a signal path from an output of a comparator in the switching power stage to a sequence control unit, which signal path includes a close-down timing circuit configured to provide a timing signal;

wherein the sequence control unit is configured to:

eliminate the input signal;

increase the switch frequency of the switching power stage; and disable the switching power stage at a moment in time within a PWM pulse of the switching power stage based on the timing signal from the close-down timing circuit.

The present invention is based on the realization that if the amplifier switch-frequency is increased before close down of the power stage, the energy stored in demodulation filter can be decreased. Moreover, in order to further decrease the close-down pop the invention also includes a close down timing circuit that can precisely control the timing of the close down in the PWM pulse.

In one exemplary embodiment the close-down timing circuit comprises:

a first current source configured to charge a capacitor during a high period of a PWM signal received from the output of the comparator with a first current, a second current source discharging the capacitor with a second current during a low period of a PWM signal received from the output of the comparator, wherein the second current is of a predefined ratio of the first current; and circuitry for providing a timing signal by detecting a threshold voltage crossing of a voltage across the capacitor.

This provides for a relatively simple solution to provide precise controlling of the "close-down timing" of the power stage. The close-down timing may depend on intended application or the overall design of the amplifier assembly, thus the proper close-down timing for a specific design may be determined in an initial calibration phase e.g. by an I2C interface.

According to another aspect of the present invention there is provided a method for close-down pop reduction in an audio amplifier assembly having an input signal and an output signal, wherein said audio amplifier assembly comprises:

a forward path comprising a compensator and a switching power stage;

a feedback path comprising a feedback filter between an output of the switching power stage and an input of the compensator;

wherein said method comprises the steps of:

eliminating said input signal;

increasing the switch frequency of the switching power stage;

disabling the switching power stage at a predefined moment in time within a PWM pulse of the switching power stage.

With this aspect of the invention, similar advantages and preferred features are present as in the previously discussed aspect of the invention.

These and other features of the present invention will in the following be further clarified with reference to the embodiments described hereinafter.

BRIEF DESCRIPTION OF THE DRAWINGS

For exemplifying purposes, the invention will be described in closer detail in the following with reference to embodiments thereof illustrated in the attached drawings, wherein.

DETAILED DESCRIPTION OF CURRENTLY PREFERRED EMBODIMENTS

In the following detailed description, some embodiments of the present invention will be described. However, it is to be understood that features of the different embodiments are exchangeable between the embodiments and may be combined in different ways, unless anything else is specifically indicated. Even though in the following description, numerous specific details are set forth to provide a more thorough understanding of the present invention, it will be apparent to one skilled in the art that the present invention may be practiced without these specific details. In other instances, well known constructions or functions are not described in detail, so as not to obscure the present invention.

Figure 1:
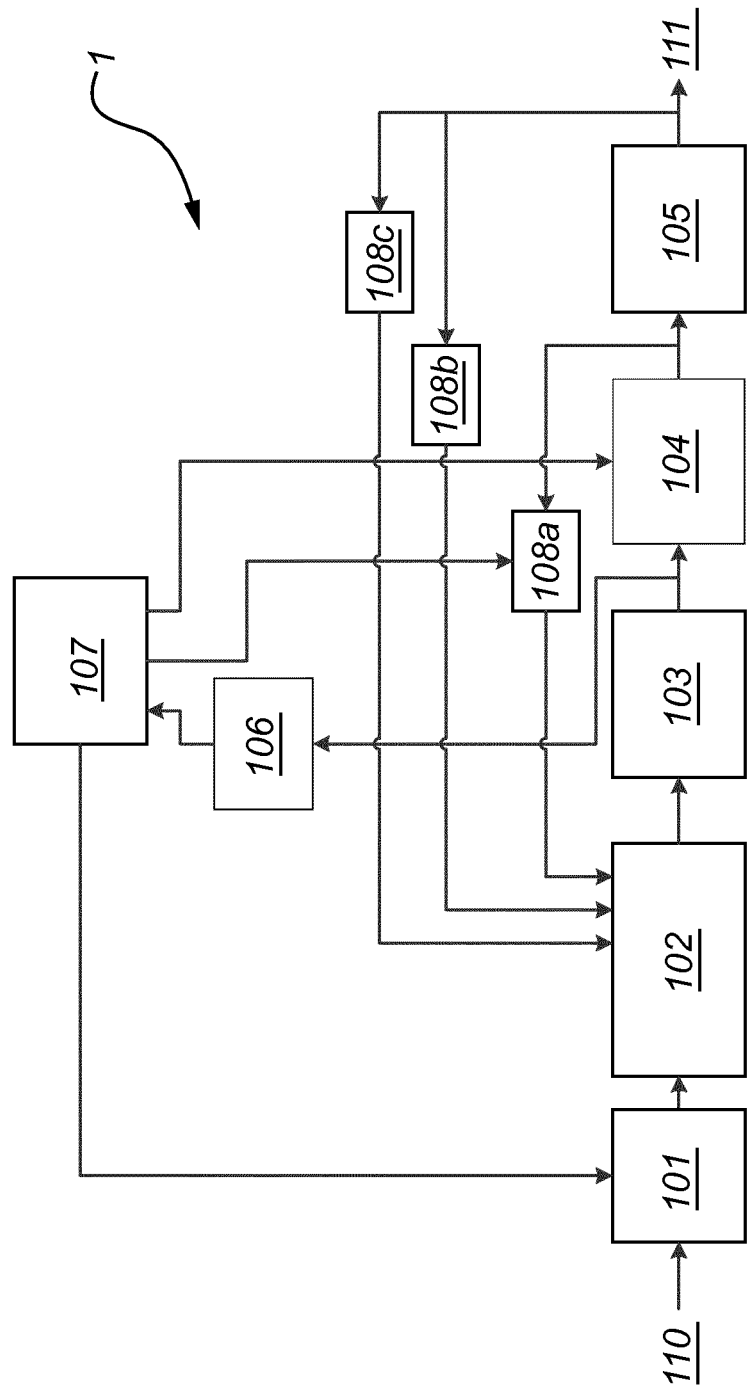
FIG. 1 is a block diagram representation of a switching power conversion system in accordance with an embodiment of the present invention.

FIG. 1 shows a block diagram of an embodiment of the invention which will be described in greater detail in the following. The system 1 in FIG. 1 comprises a class D amplifier including an attenuator 101 and/or a clipper 101, a compensator 102, a comparator 103, a power stage 104, a demodulation filter 105, a sequence controller 107, a close down timing block 106 that can find a specific point in a PWM pulse, a first feedback filter 108a that can be changed to increase the switch frequency of the system 1, a second feedback filter 108b and a third feedback filter 108c. The comparator 103 and power stage 104 may be referred to as a combined block, named a switching power stage. The system 1 has an amplifier input 110 (e.g. an audio signal) and an amplifier output 111 which may be directed to e.g. a loud speaker.

The sequence of close down may be as follows.

Firstly, the input signal should be as close to zero as possible, this is done by the attenuator 101 and/or clipper 101. Secondly, the switch frequency is slowly increased by slowly removing a pole in the first feedback filter 108a, and thirdly, the power stage 104 is disabled at a certain time in the PWM pulse.

Regarding the attenuator and clipper block:

The attenuator and clipper block 101 can be only an attenuator or only a clipper or both.

Figure 2:
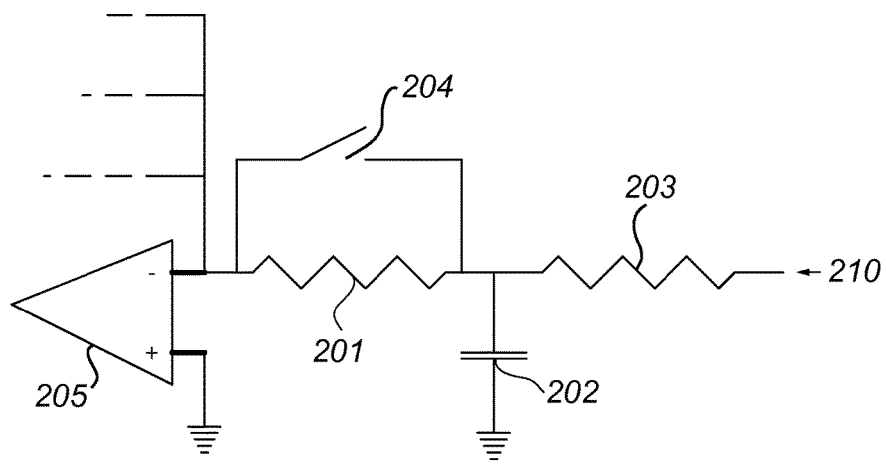
FIG. 2 is a schematic drawing of a feedback filter together with an operational amplifier and a switch in accordance with another embodiment of the present invention.

Further, increasing the switch frequency will minimize the energy in the demodulation filter 105 and this will lower the close down pop. In FIG. 2 a schematic drawing of the first feedback filter (108a in FIG. 1) together with an operational amplifier 205 is illustrated. The feedback filter can have a transfer function that consists of a pole by two resistors 201, 203 and a capacitor 202, and one end is connected to the output 210 of the power stage and the other end is connected to a negative input of an inverting operational amplifier 205, which is placed inside the compensator block. By shorting one of the resistors 201 the pole is removed. In a self oscillating amplifier this can increase the switch frequency. For clarifying purposes, it can be said that the pole will be removed in ideal systems having ideal components, i.e. the switch not having any resistance when closed and the operational amplifier being ideal. However, as readily understood by the skilled artisan, in practical implementations the pole is more likely to be moved (e.g. due to the switch still having some resistance even when it is closed (conducting)).

For minimizing the change in the gain in the feedback when the switch is on, the resistor 201 which is to be shorted should be chosen to be considerably smaller than the other resistor 203.

The resistor 201 can be shorted with a switch 204. The switch 204 can be closed slowly or fast depending on the demands in the close-down sequence. For a system implementing a switch 204 that is closed fast the timing of the closing of the switch is dependent on the intended application. The close-down timing in that case may be provided in a similar manner as the close-down timing for the power stage, i.e. with a close-down timing circuit. A system may be designed where the same close-down timing circuit provides two close-down timings; one for the close-down of the power stage and one for the closing of the switch in the feedback filter. Alternatively the system may comprise two close-down timing circuits, one for each purpose. A switch that is closed slowly may e.g. have a close-down time of above 5 μs, such as e.g. 100 μs. A switch that is closed fast may for example have a close-down time below 100 ns, such as e.g. 1 ns.

In the present context the term "switch" is to be understood as a device having a transfer function that can be varied between 0 dB (i.e. no attenuation through the device) and substantially −∞ dB (i.e. a very high attenuation through the device) according to a given, desired function of time. Correspondingly it can also be interpreted as a device that can be varied between 0 ohm (very low resistance) and ∞ ohm (very high resistance), according to a given, desired function of time. It is to be understood that closing-down time of a switch is the time when the switch goes from an open state (i.e. very high attenuation or very high resistance) to a closed state (i.e. very low attenuation or very low resistance).

Figure 3:
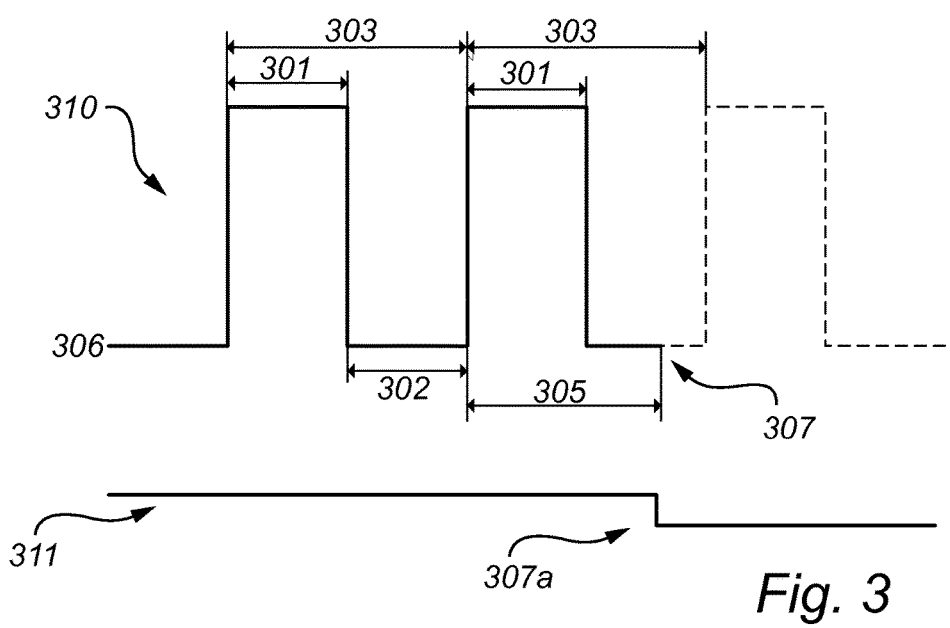
FIG. 3 illustrates a PWM signal at the output of a power stage in accordance with another embodiment of the invention.

The term "close-down timing" or how the specific time within a PWM pulse is found will be discussed in greater detail in the following with reference to FIG. 3 which illustrates a PWM signal 306 at the output 310 of a power stage of a single ended system together with a schematic signal 311 showing the enabling/disabling of the power stage. The PWM signal 306 is either high 301 or low 302, and one period 303 of the PWM signal 306 consists of one part that is "high" (positive) 301 and one part that is "low" (negative) 302. In the aforementioned close-down sequence, at the end of the second step (increasing switch frequency) and just before the third step (disabling power stage) there should be no audio output since the input is eliminated in the first part of the sequence. Hence, the duty cycle of the PWM signal 306 is approximately 50%, i.e. the width 301 of the "high" part of the PWM signal is approximately the same as the width 302 of the "low" part of the PWM signal.

The specific "close-down timing" of the power stage is to be understood as the ratio between the "close-down time" and the total period time.

$$\text{close-down timing} = \frac{\text{close-down time}}{\text{period time}}$$

The "close-down time" 305 is defined as the time from the beginning of a pulse/period, in this example being the beginning of a "high" part 301, to the close-down point 307, i.e. the point 307a in the period where the power stage is disabled. The close-down point can also be in a "high" part 301; this however depends on the intended system application. Thus, the skilled artisan readily understands that embodiments where the beginning and close-down point is within the same part of a pulse are within the scope of the invention. It is to be understood that the illustration merely serves to elucidate the concept and terminology.

The beginning of a pulse/period can alternatively be chosen to be the beginning of a "low part" 302.

From the definition, when the "close-down timing" is kept constant the "close-down time" 305 will differ for different switch frequencies. In order to minimize the audible "pop" when amplifier assemblies are disabled it is preferred to keep the "close-down timing" of the power stage constant when tolerances within the system change the switch frequencies rather than keeping the "close-down time" 305 constant. As for example in silicon implementations, there it is far more practical to match a ratio between two currents than to control an absolute value.

When choosing the optimal "close-down timing" for an application, the system can be implemented so that the close down timing is set by an I2C (inter-integrated circuit) interface. Then the amplifier assembly may be tested with different close-down timings and the one resulting in the least "pop" can be found and implemented for each device (i.e. each specific amplifier assembly) or for a design.

Figure 4:
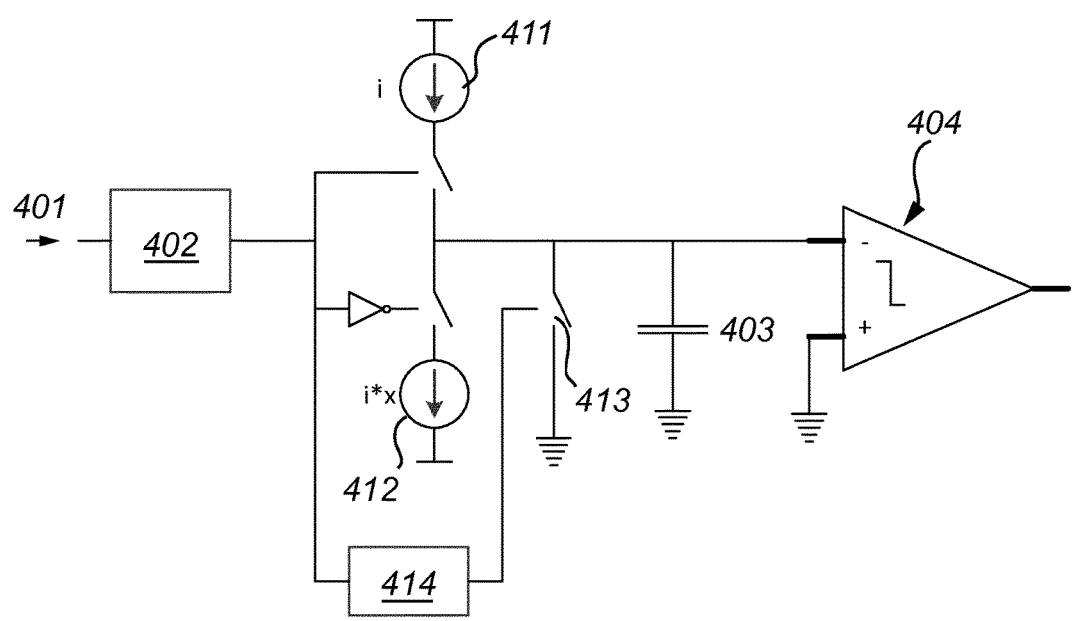
FIG. 4 is a schematic drawing of a close-down timing circuit in accordance with yet another embodiment of the present invention.

An exemplary embodiment of the close down timing block 106 from FIG. 1 is shown in FIG. 4 and which will be discussed in greater detail in the following.

Depending on the system implementation a specific timing of close down of power stage within the PWM pulse will give the lowest pop.

In FIG. 4, an example of a practical realization of finding a specific close down timing of a power stage within a PWM pulse is shown. Finding a specific timing of the close down may be done by a circuit which includes a clock divider 402 constructing half the clock of an input signal 401, a current source 411 charging a capacitor 403 (with a current i) in the clock divided PWM high period, a current source 412 discharging the capacitor 403, with a current (i*x) that is a ratio of the charging current (i), in the clock divided PWM low period and a comparator 404 measuring zero voltage crossing(s). By changing the ratio (changing the predefined constant x) between the charging and discharging current and detecting the edge of the comparator 404 output, a specific close down timing of a power stage within the PWM pulse can be constructed precisely. The rising edge detecting block 414 serves to provide a pulse with a short width when there is a rising edge at the clock divider 402 output. The operation of the close-down timing circuit in FIG. 4 is further described with reference to FIG. 5.

Figure 5:
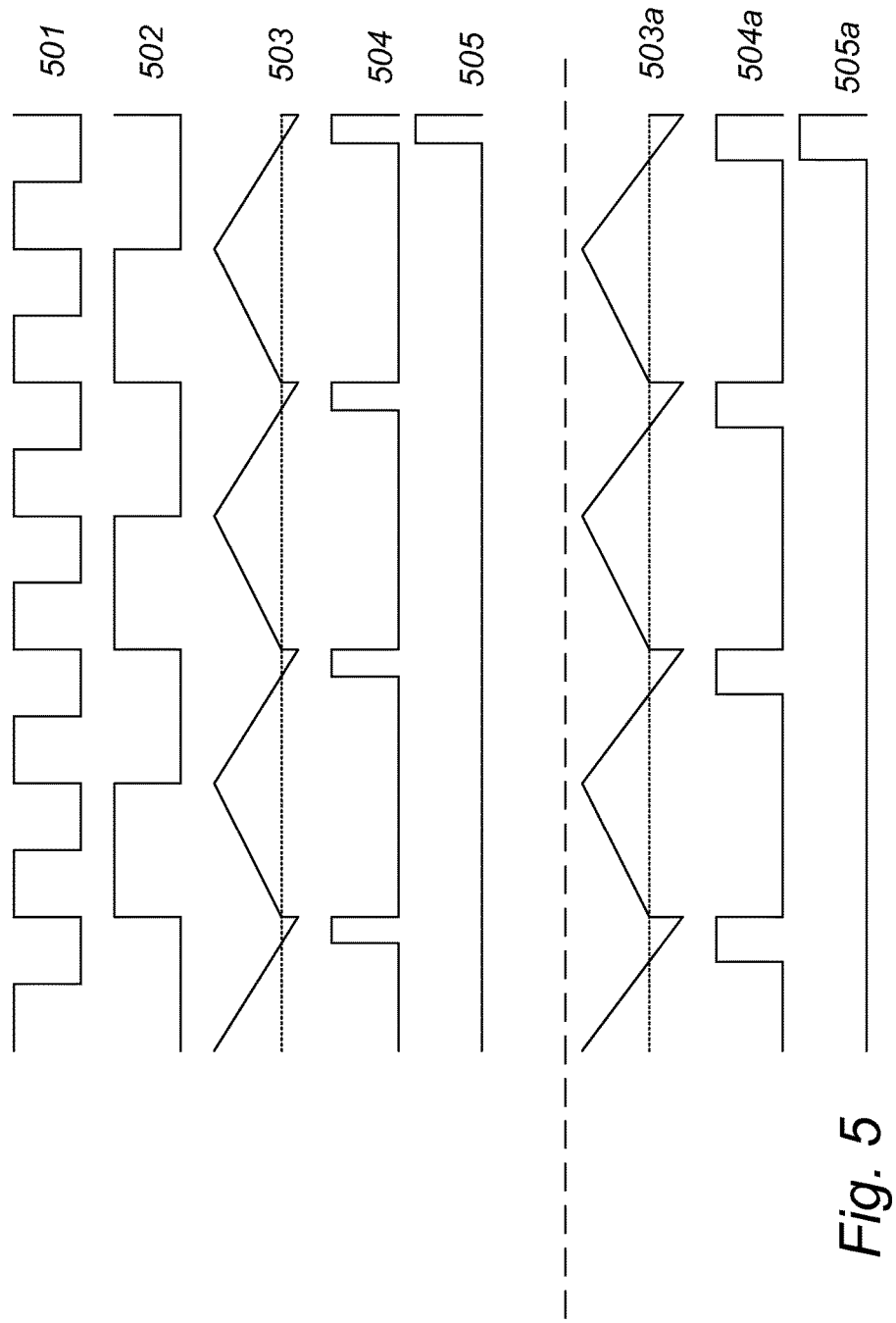
FIG. 5 illustrates various signals inside of a close down timing block in accordance with the embodiment illustrated in FIG. 4.

FIG. 5 shows signals from the circuit in FIG. 4, it should be noted that the signals illustrated in FIG. 5 are highly schematic and merely serve to further clarify an exemplary embodiment of the inventive concept; it should not be considered limiting to the invention. The first or top signal shown is the PWM input 501 to the close down timing circuit from the comparator 401. Next is the clock divider output 502, producing an output that is half the frequency of the input signal (the PWM signal in 501). The capacitor voltage 503 is the voltage over the capacitor (403 in FIG. 4). The capacitor is charged by a first current i supplied by the current generator 411, and discharged by the current generator 412 by a second current i*x, which is a product of the first current and a predefined constant. The capacitor 403 is short circuited by the switch 413 which is controlled by a rising edge detection unit 414, which closes the switch 413 and thereby short circuits the capacitor 403, when a rising edge is detected in the clock divider output signal 502. The output 504 of the comparator (404 in FIG. 4) shows the rising edges that can be used for close down of the power stage, the timing of the rising edges shown in 504 depend on zero voltage crossings of the capacitor voltage 503. The close-down edge 505 is constructed by neglecting the first three rising edges and then using the fourth rising-edge as a close-down edge 505. This neglection of rising edges will be further explained in reference to FIG. 6, more specifically in reference to section 607 in FIG. 6.

The bottom three signals in the FIG. 503a, 504a, 505a are the corresponding signals of 503, 504, 505 but with a larger predefined constant x, i.e. the discharging current is larger than in the previous example.

Figure 6:
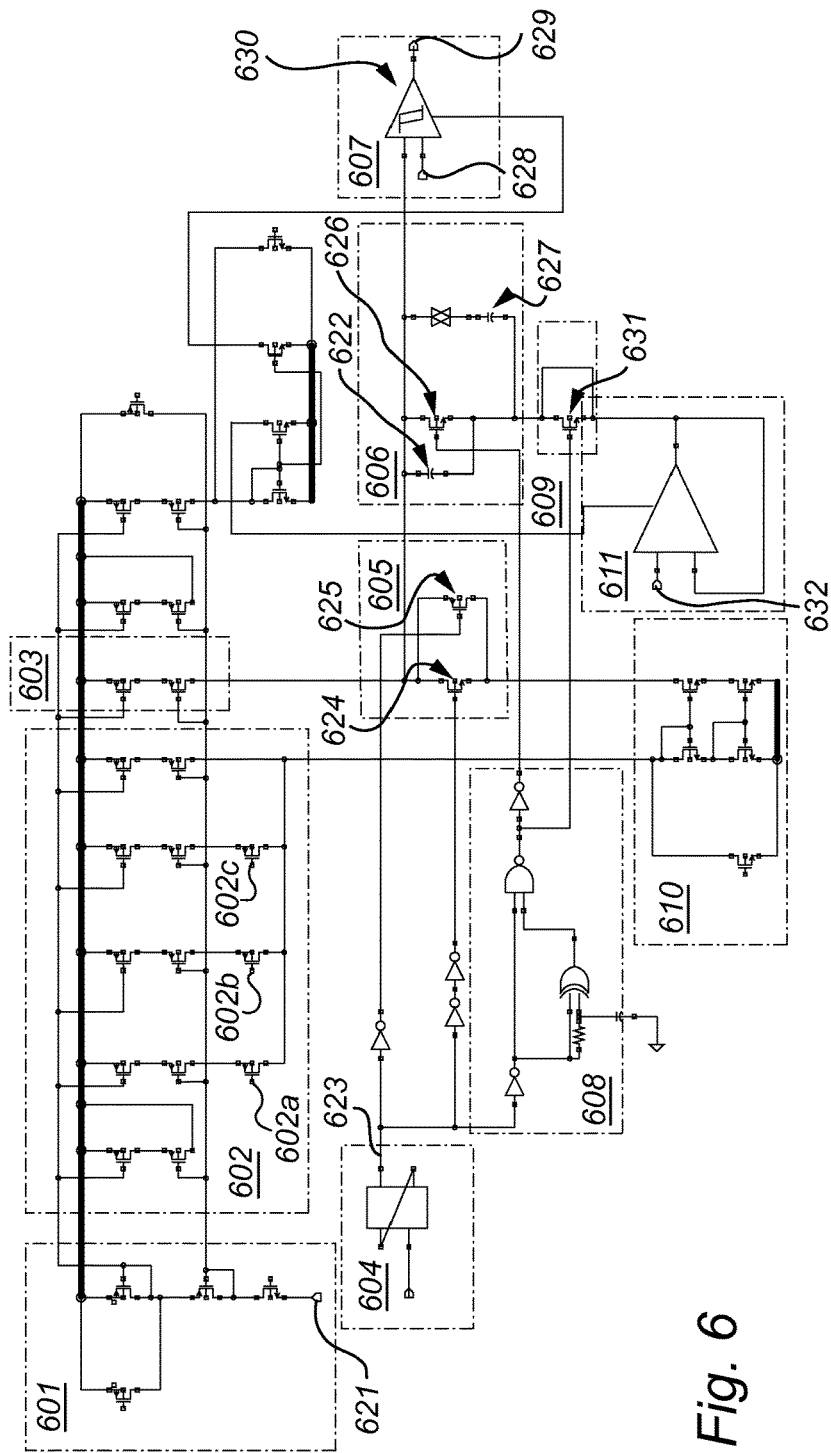
FIG. 6 illustrates a close-down timing circuit in accordance with yet another embodiment of the present invention.

FIG. 6 shows a detailed schematic of an exemplary embodiment of a close-down timing block in an integrated circuit application. Separate sections 601-611 have been marked in order to clarify the circuit in the figure and a brief description will be provided in the following. Section 601 in the close-down timing block includes input 621 for a reference current for the charging and discharging currents of the capacitor 622. The next section 602 comprises different current mirrors which can be used to choose between different close-down timings. This is done by changing the current that discharges a capacitor 622 in section 606 through the current mirror in section 610 and the switches 624, 625 in section 605. The different gate signals 602a-c in section 602 are used for setting different discharge currents of the capacitor 622 in section 606. In section 603 is a current mirror used for the charging current of the capacitor 622. Further, section 604 has a clock divider that outputs 623 a signal that is half the frequency of its input signal. Section 605 contains switches that make a path for the discharge of the capacitor 622 in section 606. There are two switches 624, 625 in section 605, and the two switches 624, 625 are coupled in parallel for minimizing switching noise. When the two switches 624, 625 switch in or out the switching capacitance from one of the two switches 624, 625 is compensated by the other one of the two switches 624, 625.

As mentioned, section 606 has a capacitor 622; however it also has a switch 626 that can short circuit the capacitor 622. There is further a second capacitor 627 in section 606 which may be chosen to switch in parallel with the first capacitor 622, e.g. if one would want the system to work at a lower switch frequency. For example, if the switch frequency is not increased before close-down, the second capacitor 627 can be coupled in parallel with the first capacitor 622. This may for example be useful if one would like to avoid high frequency switching, e.g. in systems that have a big power stage where high frequency switching would result in high losses.

Further, section 607 comprises a comparator 630 that can measure when a voltage over the first (or primary) capacitor 622 is below a comparison/reference voltage 628 in order to generate a close-down timing signal 629. The close-down system can have some initialization time before the generated close-down timing of the power stage within the PWM-pulse is precise enough, so generally the first "rising edge(s)" outputted by the comparator 630 is(are) not used for the "close-down". A cascade of clock dividers can be used to neglect the first rising edge(s) and make sure the system is working properly before any rising edge is used as a "close-down edge". Next, section 608 includes circuitry for generating a short pulse in order to turn on the switch 626 in order to short circuit the capacitor 622, similarly to the operation of the rising edge detection block 414 in FIG. 4. Section 609 contains a switch 631 that works at the same time as the switch 626 and compensates for the parasitic capacitances in switch 626 when it operates. Section 610 contains a current mirror which is used for the discharging current of the capacitor 622, and section 611 contains a buffer for the reference voltage 632 that the capacitor 622 is coupled to. The buffer in section 611 isolates the system from affecting the capacitor reference voltage 632 (if other circuits use this voltage) when the switch 626 is switched on and off, and furthermore the buffer keeps the output voltage of the buffer in 611 constant. The reference voltage 632 may be chosen to be higher than the other reference voltage 628 in section 607. This is in order to ensure that the comparator 630 is not mistakenly triggered when the switch 626 in section 606 is short circuiting the capacitor 622.

Figure 7:
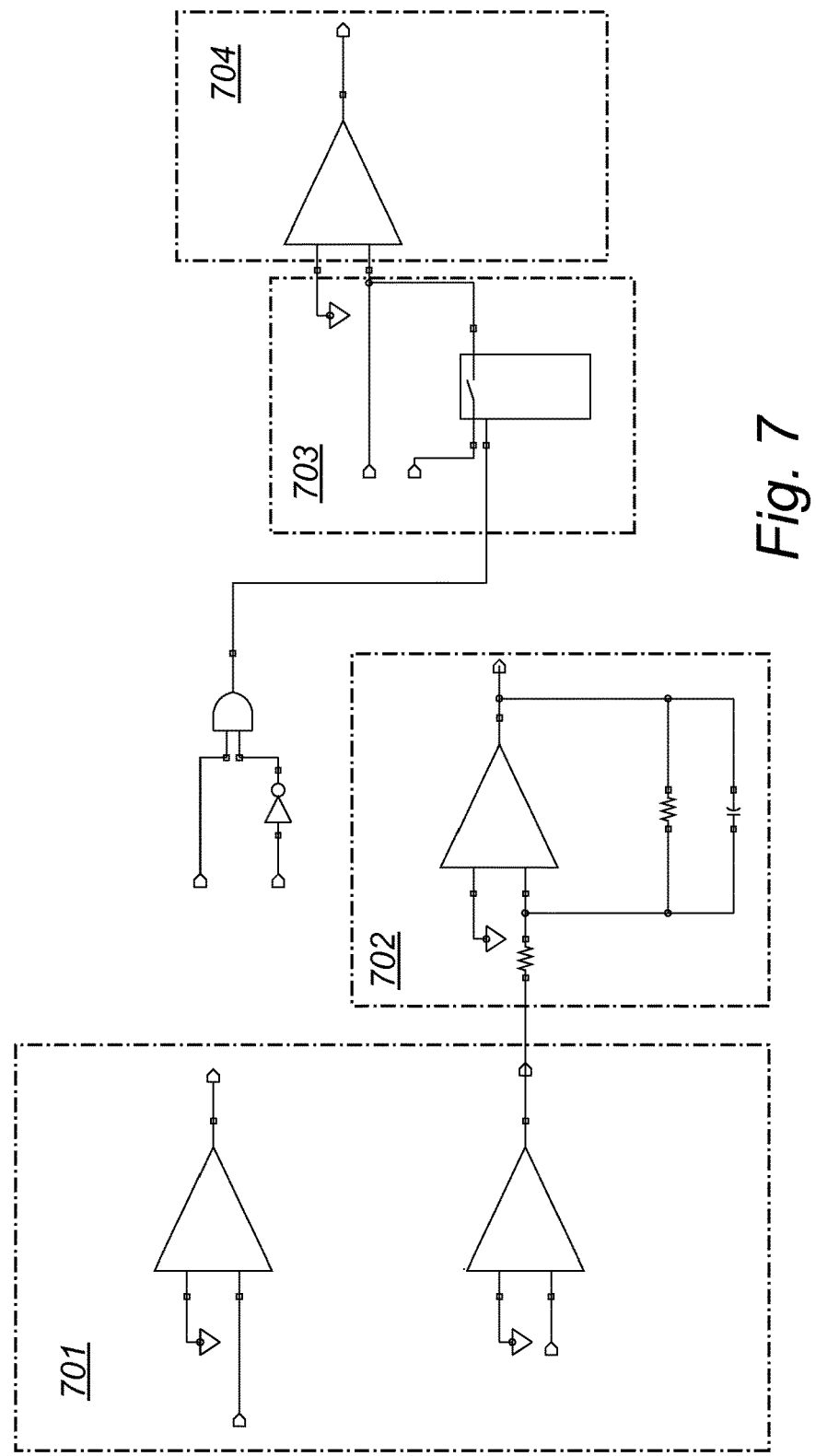
FIG. 7 is a circuit representation of a part of a compensator and a switch in accordance with yet another embodiment of the present invention.

In FIG. 7 a detailed schematic of a compensator and "feedback switch" in an integrated circuit application is shown. This figure will follow a similar logic with marked sections 701-704 which will be described separately. Section 701 contains two operational amplifiers of the compensator, and section 702 contains an additional operational amplifier of the compensator that is coupled as an inverter. Next, in section 703, a switch 704 is shown which corresponds to the switch 204 shown in FIG. 2. Section 704 includes another operational amplifier of the compensator, where the negative input of the operational amplifier in section 704 is coupled to the switch 703 and to a port.

Figure 8:
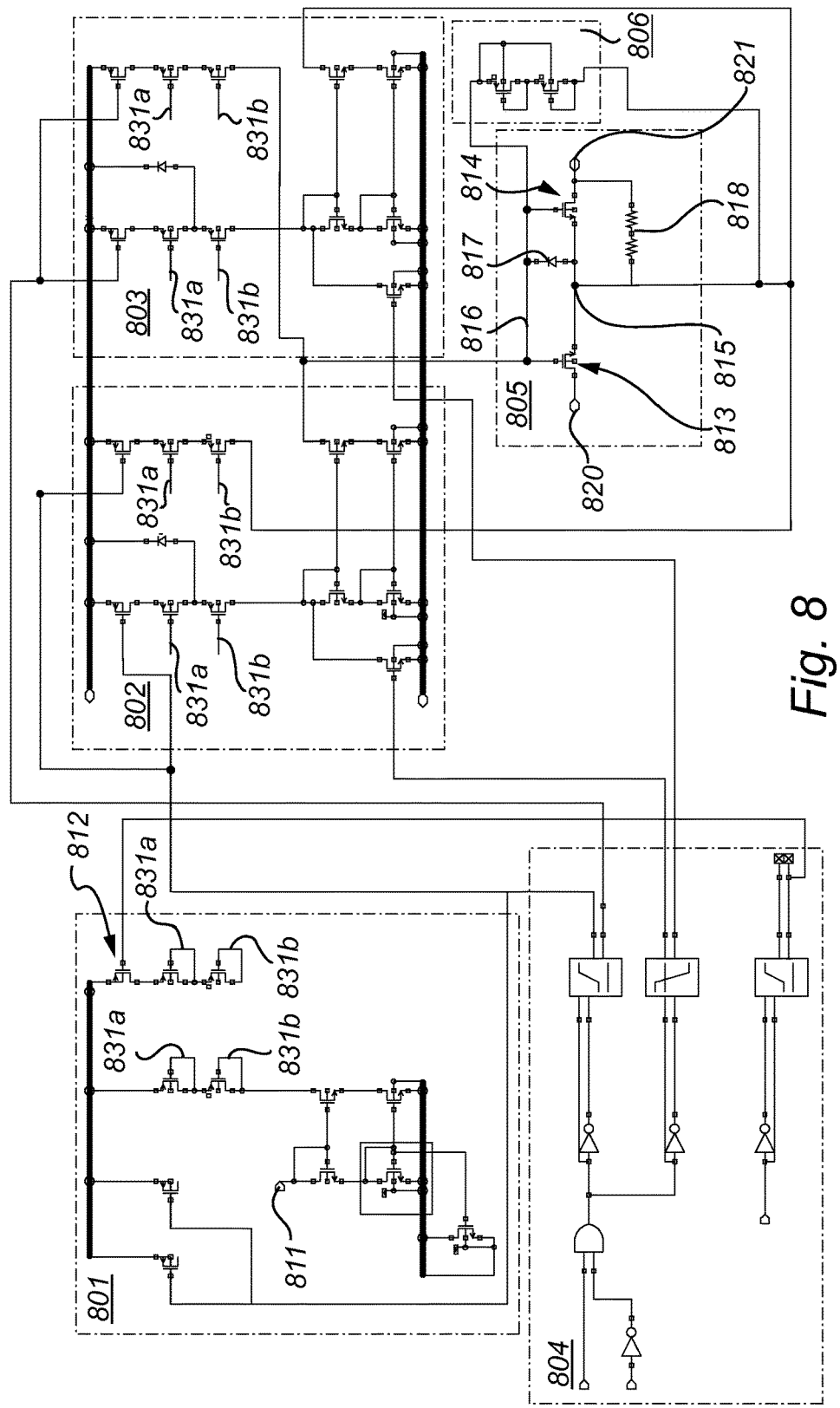
FIG. 8 illustrates an implementation of a switch in accordance with yet another embodiment of the present invention.

FIG. 8 illustrates a detailed schematic configuration for integrated circuit applications of a feedback switch. FIG. 8 has been divided in separate sections 801-806 in a corresponding fashion as in FIGS. 6 and 7. Section 801 illustrates the bias distribution. The input reference bias current enters at port 811. A gate signal 812 can add an extra path to change the bias of the system. In section 802 an "off circuit" for the switches 813 and 814 is shown. By delivering current into point 815 (source node) and pulling current out of point 816 (gate node), the voltage between the point 816 and 815 is lowered and the two switches 813, 814 are turned off. References 831*a* and 831*b* represent common signals between the different sections.

Further, section 803 contains an "on circuit" for the switches 813, 814 in section 805. Correspondingly, by delivering current into point 816 and pulling current out of point 815, the voltage between points 816 and 815 is increased and the switches 813, 814 are turned on. Since the current delivered to point 816 is very similar to the current pulled from point 815, only a small current (small magnitude) will be running into the points 820 and 821 in section 805. The current delivered/pulled to/from point 816 and point 815 together with the capacitance of the switches 813, 814 and the diode 817, and the circuit in section 806 determines how fast the switches 813, 814 are switching (i.e. changing from off to on and vice versa). An extra capacitor can be added between the gate node 816 and the source node 815 of the two switches 813, 814 in order to increase the switching time more. In section 804 enabling circuits and bias current level control circuits are illustrated. In section 805, as mentioned, the switches 813, 814 and the components associated with them are shown. The two transistors 813, 814 coupled in serial, are creating the switch function. The diode 817 is used to protect the voltage difference between point 816 and point 815 (i.e. between the gates and the sources of the switches 813, 814). By protect it is meant that the voltage cannot get too high or too low, which could lead to break-down of the two MOSFETs 813, 814. The resistance 818, here in the form of two resistors, is a very high value resistance in order to keep the midpoint 815 voltage value near the voltage value of point 821, when the switch/switches is/are off.

Section 806 contains two transistors for limiting the different voltages between point 816 and 815 when the switch/switches is/are on or off, i.e. when the system is operating normally.

Figure 9:
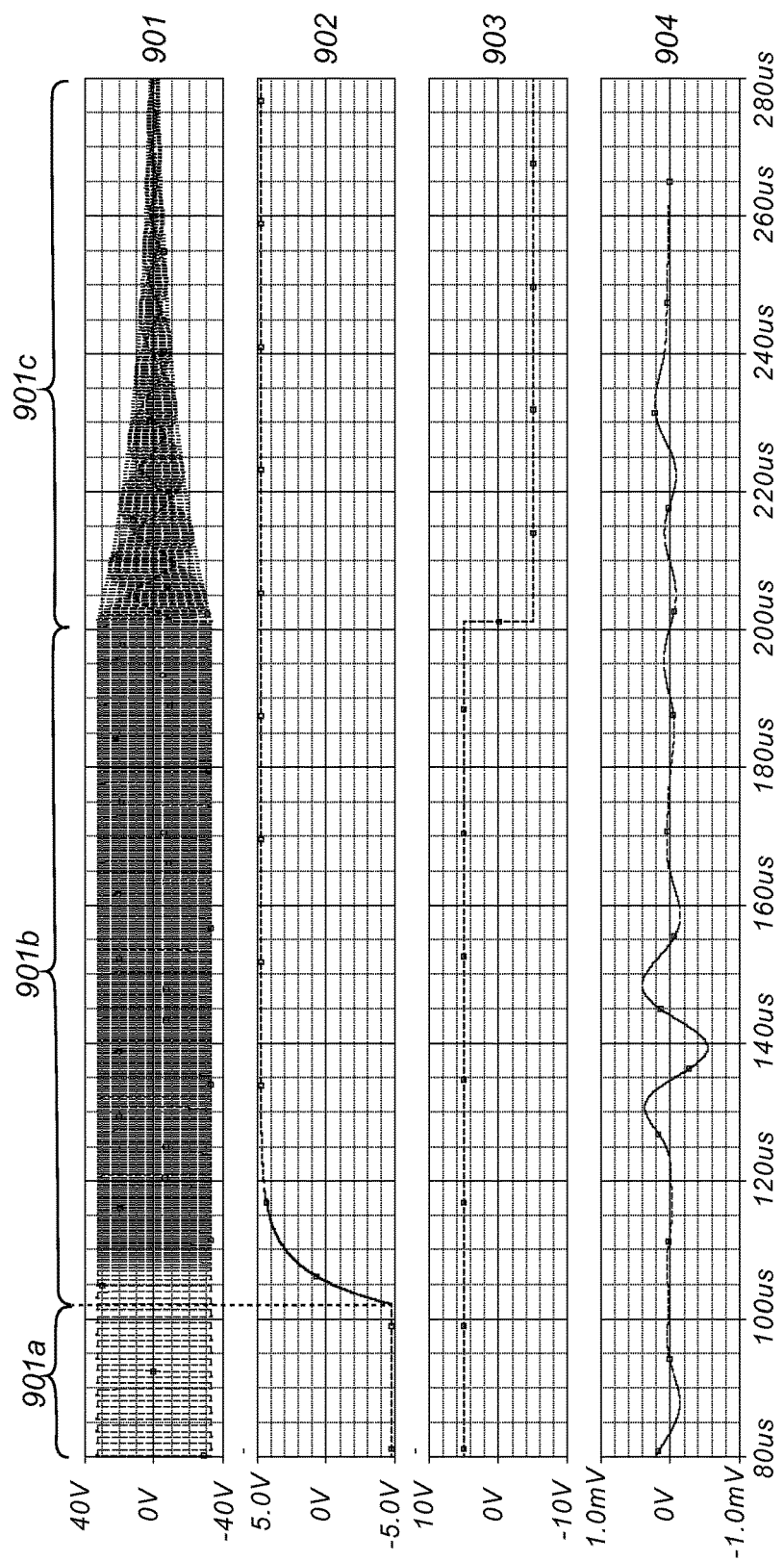
FIG. 9 illustrates a simulation showing voltage signals at different parts of a switching power conversion system in accordance with yet another embodiment of the present invention.

FIG. 9 shows a simulation of the close-down sequence. The signal graphs 901-904 show voltages on the Y-axis and time on the X-axis. Signal 901 corresponds to the output of the power stage. In the beginning 901*a* there is a PWM-signal, afterwards 901*b* the PWM frequency (switch frequency) is slowly increased (by the removal of a pole in a feedback filter), and in the end 901*c*, after the power stage has been disabled, there is some residual ringing that is slowly decreasing. Next, the signal 902 for controlling the switch for increasing the switch frequency is shown. Here it can be observed that the signal 902 is rising relatively slowly, in order to slowly turn the switch on and thereby slowly increase the switch frequency. Then a signal 903 for enabling or disabling the power stage is shown, it can be observed that the power stage is disabled by the signal in 903 at the beginning of 901*c*. Lastly the output signal 904 of the amplifier, after it has been filtered through a demodulation filter (low pass filter) and an additional low pass filter for removing switching ripple so that the audio band signal is more visible, is shown.

The invention has now been described with reference to specific embodiments. However several variations of the switching power conversion system are feasible. For example, the system may be applied to several different applications, such as e.g. in two level or multi level modulation, single ended amplifiers, BTL (Bridge Tied Load) dual supply, etc. Further the close-down timing circuit can be constructed in various ways, e.g. the construction of the close down time point can be made with other types of circuits. As for example, a circuit that simply makes an RC delay from an edge of the PWM signal can also be used. Alternatively, a digital circuit can be used to make a given delay from an edge of the PWM signal to the close down time point. To have enough precision in the delay, the clock frequency of the digital circuit should be above a certain frequency, e.g. for most applications this frequency could be at least more than 40 MHz.

Moreover, the increase in switch frequency before close down can be made in many different ways. For example, in self-oscillating systems the frequency increase can be made in other ways than moving/removing the pole in inner feedback loop, it can alternatively be done by changing poles and zeroes and gains in the other feedbacks circuits and/or in the compensator.

In non self-oscillating systems the switch frequency can be increased in many different ways, such as e.g., changing the frequency of the triangular wave in triangle modulators or modifying the digital modulator in order to change the switch frequency in systems with digital modulator.

Such and other obvious modifications must be considered to be within the scope of the present invention, as it is defined by the appended claims. It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting to the claim. The word "comprising" does not exclude the presence of other elements or steps than those listed in the claim. The word "a" or "an" preceding an element does not exclude the presence of a plurality of such elements.

The invention claimed is:

1. A close-down pop reduction system for an audio amplifier assembly having an input signal and an output signal, said close-down pop reduction system comprising:
   a forward path between the input signal and the output signal comprising a compensator connected to a switching power stage; and
   a signal path from an output of a comparator in the switching power stage to a sequence control unit, which signal path includes a close-down timing circuit configured to provide a timing signal;
   wherein said sequence control unit is configured to:
     eliminate the input signal;
     increase the switch-frequency of the switching power stage; and
     disable the switching power stage at a moment in time within a PWM pulse of the switching power stage based on said timing signal from said close-down timing circuit.

2. The close-down pop reduction system according to claim 1, wherein said close-down timing circuit comprises:
   a first current source configured to charge a capacitor during a high period of a PWM signal received from the output of the comparator with a first current,
   a second current source discharging the capacitor with a second current during a low period of a PWM signal received from the output of the comparator, wherein the second current is of a predefined ratio of the first current; and
   circuitry configured to provide a timing signal by detecting a threshold voltage crossing of a voltage across the capacitor.

3. The close-down pop reduction system according to claim 2, wherein said close-down timing circuit further comprises a clock divider between the output of the comparator and the close-down timing circuit, in order to provide a PWM signal of lower frequency to the close-down timing circuit.

4. The close-down pop reduction system according to claim 1, further comprising a feedback path comprising a feedback filter between an output of the switching power stage and an input of the compensator, said feedback filter comprising:
   two resistors connected in series;
   a capacitor connected between the two resistors and ground;
   a switch connected across one of said two resistors;
   wherein said sequence control unit is configured to close the switch in order to move a pole in a transfer function of said feedback filter, thereby increasing the switch frequency of the switching power stage.

5. The close-down pop reduction system according to claim 4, wherein the switch is connected across the resistor having a lowest resistance value of said two resistors.

6. The close-down pop reduction system according to claim 4, wherein said sequence control unit is configured to control said switch to go from a open state to a closed state in a within a time-period of 5 microseconds to 200 microseconds.

7. The close-down pop reduction system according to claim 4, wherein said sequence control unit is configured to control said switch to go from a open state to a closed state in a within a time-period of 0,1 nanoseconds to 100 nanoseconds.

8. The close-down pop reduction system according to claim 1, wherein the timing signal is derived from a ratio of a duration of time from the start of a PWM period until a close-down point within said PWM period and a total period time of a PWM signal.

9. The close-down pop reduction system according to claim 1, wherein said forward path further comprises an attenuator connected between said input signal and said compensator, wherein said sequence control unit is configured to eliminate the input signal by controlling said attenuator.

10. A method for close-down pop reduction in an audio amplifier assembly having an input signal and an output signal, wherein said audio amplifier assembly comprises:
   a forward path comprising a compensator and a switching power stage;
   a feedback path comprising a feedback filter between an output of the switching power stage and an input of the compensator;
   wherein said method comprises the steps of:
   eliminating said input signal;
   increasing the switch frequency of the switching power stage;
   disabling the switching power stage at a predefined moment in time within a PWM pulse of the switching power stage.

* * * * *